United States Patent [19]
Horita et al.

[11] Patent Number: 5,892,278
[45] Date of Patent: Apr. 6, 1999

[54] ALUMINUM AND ALUMINUM ALLOY RADIATOR FOR SEMICONDUCTOR DEVICE AND PROCESS FOR PRODUCING THE SAME

[75] Inventors: Hideo Horita; Yoichi Miura; Masato Sasaki; Yoshio Hirayama, all of Tokyo-To, Japan

[73] Assignees: Dai Nippon Printingco., Ltd.; Nippon Light Metal Company, Ltd., both of Japan

[21] Appl. No.: 861,191

[22] Filed: May 21, 1997

[30] Foreign Application Priority Data

May 24, 1996 [JP] Japan .................................... 8-151794
Jul. 2, 1996 [JP] Japan .................................... 8-189917

[51] Int. Cl.$^6$ ............................ H01L 23/10; H01L 23/34
[52] U.S. Cl. .......................... 257/706; 257/707; 257/796
[58] Field of Search .................................... 257/706, 707, 257/796

[56] References Cited

U.S. PATENT DOCUMENTS 4,012,769  3/1977  Edwards et al. .
4,939,316  7/1990  Mahulikar et al. .
5,367,196  11/1994  Mahulikar et al. .
5,403,975  4/1995  Pasqualoni .

*Primary Examiner*—Mahshid Saadat
*Assistant Examiner*—S. V. Clark
*Attorney, Agent, or Firm*—Parkhurst & Wendell, L.L.P.

[57] ABSTRACT

An aluminum or aluminum alloy radiator possessing high reliability and excellent heat dissipation is provided. A process for producing an aluminum alloy radiator is also provided which has improved adhesion between the radiator and the mold resin and can prevent cracking in a resin molded portion.

The aluminum alloy radiator, for a plastic molded type semiconductor device, comprising an anodized aluminum-iron alloy having an iron content of 0.5 to 3.0% by weight or an anodized aluminum-silicon alloy having a silicon content of 0.5 to 3.5% by weight. The process for producing an aluminum alloy radiator for a plastic molded type semiconductor device, comprising the steps of: anodizing an aluminum alloy; and subjecting the anodized aluminum alloy to sealing, wherein the aluminum alloy radiator after the sealing is heat-treated at a temperature of 180 to 250° C.

4 Claims, 1 Drawing Sheet

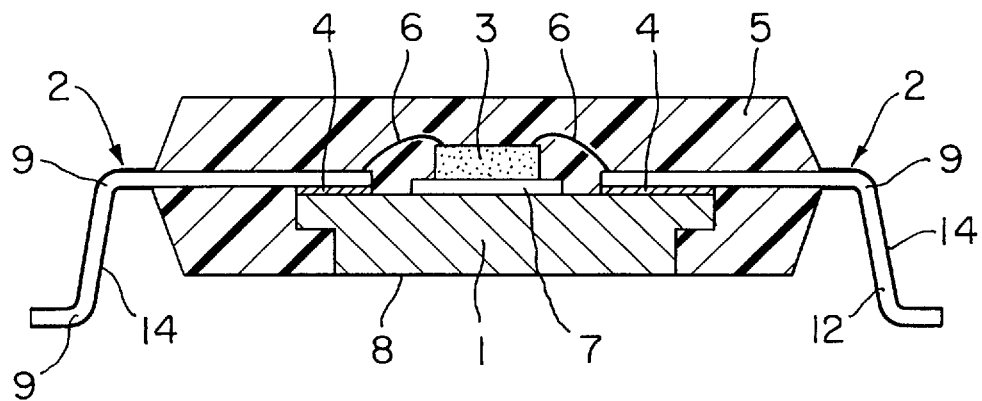
F I G. 1
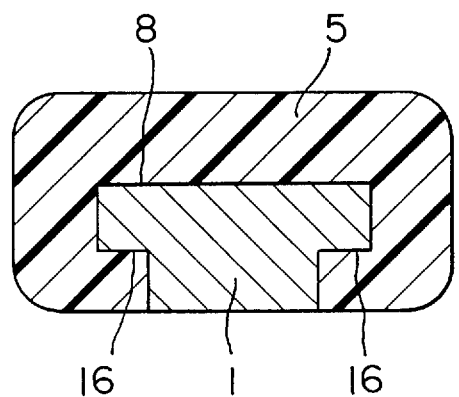
F I G. 2 even if it is heated by heating in the course of brazing, is less likely to cause cracking in the mold resin and is less likely to cause cracking in the interface of the radiator and the mold resin.

ALUMINUM AND ALUMINUM ALLOY RADIATOR FOR SEMICONDUCTOR DEVICE AND PROCESS FOR PRODUCING THE SAME

FIELD OF THE INVENTION

The present invention relates to an aluminum or aluminum alloy radiator for use in a plastic molded type semiconductor device loaded with a semiconductor element and a process for producing the same, and in particular to an aluminum alloy radiator which has improved adhesion to a mold resin, does not cause peeling in the interface of the radiator and the mold resin and, in addition, is free from the creation of package cracking.

BACKGROUND OF THE INVENTION

In recent years, for semiconductor devices, an increase in integration density and speed is significant from the viewpoint of coping with an increase in performance and a reduction in size and weight of electronic equipment. Packages having various structures have been proposed in order to realize a reduction in size and to avoid problems of increased calorific value and noise involved in the above tendency. In particular, a structure wherein a heat sink is previously mounted on a lead frame and a structure wherein a heat sink is incorporated at the time of resin molding in the step of assembling a semiconductor device have been proposed as one means for realizing a plastic molded package structure having good heat dissipation.

The most widely used package is a plastic package prepared by transfer molding. The construction of such a plastic package is shown in FIG. 1. The plastic package comprises a semiconductor chip 3, a die pad 7, a bonding wire 6, a lead frame 2, and a mold resin 5. In this plastic package, the semiconductor chip 3 is loaded on the die pad 7 and is electrically connected through the bonding wire 6 to each lead of the lead frame 2, followed by molding using a mold resin 5, such as an epoxy resin. Thereafter, the exterior of an outer lead 12 of the lead frame 2 is then plated to form an outer plating 14, and a bent portion 9 as shown in the drawing or the like is formed to complete a plastic package.

In the case of low power consumption and microcomputers and memories where there is no special requirement for electrical characteristics, this plastic package has a satisfactory function as an inexpensive, high reliable package. On the other hand, in the case of devices where the power consumption is high and strict requirement for electrical characteristics should be met, various improvements have been made in the plastic package, leading to the development and practical use of a plastic package having low heat resistance and excellent electrical characteristics.

In particular, regarding an improvement in heat dissipation of a plastic package having the above construction, a radiator 1 is provided so as to thermally come into contact with a lead frame or a die pad to improve the heat dissipation. In one case, the radiator is provided within a resin package 5, and in other case, it is provided so that part of the radiator is exposed to the outside of the package. Copper and aluminum materials having high thermal conductivity are used as the material for the radiator 1. A radiator using aluminum is anodized to form an anodic oxide film 8 from the viewpoints of improving the corrosion resistance and improving the decorative property and is black colored particularly from the viewpoint of improving heat dissipation and the like.

A dye is used for coloring of the anodized radiator. The anodic oxide film has micropores extending perpendicularly to the surface thereof, and deposition of an organic black dye onto the micropores permits the anodic oxide film to be black colored. The organic dye forms a chelate with a metallic ion centered, thereby forming a chelate dye. Further, replacement of part of the dye molecule with other ions, for example, an alkali metal such as sodium or potassium, or addition of a salt, such as ammonium acetate, as a pH buffer is performed to improve the water solubility, dyeing property and other properties of the dye.

However, an alkali metal ion having high mobility in the semiconductor is unfavorably eluted from the dyed anodized film. In some applications, this leads to a fear of the reliability of the semiconductor element being deteriorated. There is an ever-increasing tendency for an increase in speed and capacity of electronic circuits, rendering measures against the generation of heat important. For this reason, provision of a colored radiator which, as compared with the conventional radiator, has better heat dissipation and is less likely to cause elution of ion components has been desired in the art.

Further, in the prior art, a gap is likely to be created between the radiator 1 and the mold resin 5. The presence of this gap results in remarkably deteriorated heat dissipation. Further, heating involved in brazing at the time of mounting on a printed board is likely to create cracking in the mold resin. For this reason, high adhesion is required between the radiator 1 and the mold resin 5. In the prior art, however, no satisfactory adhesion is provided between the aluminum alloy radiator 1 and the mold resin 5, and, in addition, cracking is likely to be created in the resin, unavoidably causing a deterioration in heat dissipation.

SUMMARY OF THE INVENTION

An object of the present invention is to provide an aluminum and an aluminum alloy radiator possessing high reliability, excellent heat dissipation, and black color tone. Another object of the present invention is to provide a process for producing an aluminum alloy radiator which can improve the adhesion between an aluminum alloy radiator and a mold resin and can prevent cracking in the mold resin.

According to one aspect of the present invention, there is provided an aluminum alloy radiator, for a plastic molded type semiconductor device, comprising an anodized aluminum-iron alloy having an iron content of 0.5 to 3.0% by weight or an anodized aluminum-silicon alloy having a silicon content of 0.5 to 3.5% by weight.

According to another aspect of the present invention, there is provided a process for producing an aluminum alloy radiator for a plastic molded type semiconductor device, comprising the steps of: anodizing aluminum or an aluminum alloy; and subjecting the anodized aluminum or aluminum alloy to sealing, wherein the aluminum alloy radiator after the sealing is heat-treated at a temperature of 180° to 250° C.

The present invention has the following effects and advantages.

Specifically, use of an aluminum alloy capable of developing a gray or black color upon anodization, and anodization to form a heat slug (heat slug: a thick radiator sealed into a semiconductor package) can offer a radiator, for a semiconductor device, which has excellent heat dissipation and electrical insulating properties and is less likely to cause ionic contamination and has high reliability. Further, anodization of an aluminum alloy radiator, for a semiconductor device, and sealing followed by heating results in the provision of a radiator, for a semiconductor device, which has improved adhesion to the mold resin, can effectively prevent the creation of peel in the interface of the radiator and the mold resin and, in its turn, does not create any package cracking.

BRIEF DESCRIPTION OF THE DRAWINGS

FIG. 1 is an explanatory cross-sectional view showing one embodiment of a plastic packaged radiator; and FIG. 2 is an explanatory enlarged view showing the construction of an experimental product prepared in examples of the present invention and comparative examples.

DETAILED DESCRIPTION OF THE INVENTION

The aluminum and aluminum alloy radiator of the present invention may be produced by any of casting, forging, and pressing. Coloring of an anodic oxide film by an alloying constituent contained in the aluminum alloy is utilized in the coloring of the aluminum alloy. The color tone varies according to an alloying constituent(s) and state of solid solution of the alloying constituent in aluminum, and state of precipitation of the alloying constituent. Some examples of colors which can be developed are listed in Table 1.

TABLE 1

| Alloying constituent in aluminum alloy (wt %) | State of existence of alloying constituent | Color of anodic oxide film |
|---|---|---|
| Copper | Solid solution | Yellow-green |
| Silicon | Precipitate | Gray-black |
| Manganese | Solid solution | Pink |
|  | Precipitate | Gray-black |
| Chromium | Solid solution | Yellow |
|  | Precipitate | Gray-black |
| Iron | Precipitate ($FeAl_3$) | Pearl |
|  | Precipitate ($FeAl_6$) | Gray-black |

As shown in Table 1, the color which develops upon anodization varies depending upon the alloying constituent and the state of presence of the alloying constituent, and the depth of the color varies depending upon the amount of the alloying constituent and electrolysis conditions for anodization. Further, the present inventors have made studies on heat dissipation of aluminum-iron, aluminum-silicon, and aluminum-iron-manganese alloys and pure aluminum. The results are summarized in Table 2.

TABLE 2

| Alloy system | Infrared integrated emissivity (%) | |
|---|---|---|
|  | 4.5–8.0 μm | 4.5–20.0 μm |
| Al—Fe | 63 | 80 |
| Al—Si | 57 | 80 |
| Al—Fe—Mn | 66 | 81 |
| Pure aluminum (99%) | 32 | 65 |
| Pure aluminum (99%) + dying | 32 | 66 |

The results given in Table 2 were obtained as follows. Specifically, an aluminum plate with an anodic oxide film formed thereon was held at 100° C., infrared energy radiated from the plate was measured with FTIR (Fourier transform infrared spectroscopic analyzer), and the integrated value of the relative intensity determined by taking the intensity of radiation from a perfect black body as 100% was expressed as the emissivity of each specimen. For the alloys other than pure aluminum, an anodic oxide film was formed on materials capable of developing a black color upon precipitation of the alloying constituent, followed by measurement of the emissivity. As a result, for all the alloys, the infrared emissivity of the anodic oxide film was superior to that of a transparent anodic oxide film on the pure aluminum. That the emissivity is large means that heat dissipation is large, permitting a semiconductor device to be usable at a lower temperature. The integrated emissivity of the pure aluminum was low, and dyeing of the pure aluminum resulted in mere small improvement in emissivity.

The present inventors have then made analysis on contaminant ions eluted from radiators. Specifically, a radiator was immersed in heated ultrapure water for 15 min to elute ions, and the ultrapure water was then analyzed by ion chromatography to determine eluted ions. The results are summarized in Table 3. The results given in Table 3 show that there is a significant difference in elution of sodium and $NH_4$ between the dyed material and the undyed materials, suggesting that the dyed material has a fear of causing a deterioration in reliability.

TABLE 3

| Material under test | Eluted ion (ng/cm$^2$) | | | | | | |
|---|---|---|---|---|---|---|---|
|  | Na | $NH_4$ | K | Cl | $NO_2$ | $PO_4$ | $SO_4$ |
| Pure aluminum (dyed) | 183 | 32 | 3 | 32 | — | 33 | 570 |
| Pure aluminum (not dyed) | 21 | 10 | 3 | 24 | — | — | 720 |
| Al—Fe alloy (not dyed) | 25 | 14 | 3 | 27 | — | 2 | 640 |
| Al—Si alloy (not dyed) | 32 | 11 | 2 | 30 | 2 | — | 600 |

The present inventors have made studies on further detailed conditions. As a result, in the case of an aluminum-iron-base alloy, the concentration of iron influenced the color of the resultant anodic oxide film, and an iron content of not more than 0.5% was unsatisfactory in the depth of gray color of the anodic oxide film. In the case of an iron content of not less than 2%, the corrosion resistance gradually decreased with increasing the iron content although a deep gray film could be formed. In this case, an iron content exceeding 3.0% caused a deterioration in corrosion resistance to such an extent as will pose a problem in practical use. Further, addition of manganese or nickel in an amount of 0.2 to 0.8% to the aluminum-iron alloy was effective in improving the tone of the colored film, as well as in preventing uneven color development, resulting in improved evenness of the color tone of the anodic oxide film on the aluminum alloy. Presence of silicon as an impurity in a large amount in the alloy results in the formation of a ternary compound of aluminum-iron-silicon alloy which consumes iron as an element for coloring the alloy. This reduces the depth of the color and is likely to create spot-like uneven color. For this reason, the content of silicon as an impurity is preferably limited to not more than 0.2%. The addition of titanium in an amount up to 0.1% and boron in an amount up to 0.05% has no particular influence and, hence, raises no problem.

In the aluminum-silicon-base alloy, the concentration of silicon influences the color of the anodic oxide film, and a silicon concentration of not more than 0.5% did not offer any satisfactory gray color. On the other hand, in the case of a silicon concentration of not less than 2%, the corrosion resistance gradually decreased with increasing the silicon concentration although a film having a deep gray color could be formed. In this case, a silicon content exceeding 3.5% caused a deterioration in corrosion resistance to such an extent as will pose a problem in practical use. In this alloy system, presence of iron as an impurity in a large amount results in the formation of a ternary compound of aluminum-iron-silicon alloy which consumes silicon as an element for coloring the alloy, resulting in reduced depth of the color. For this reason, the content of silicon as an impurity is preferably limited to not more than 0.2%.

In the anodization, sulfuric acid, which is less likely to influence the color tone of the anodic oxide film, is used as an electrolyte. Oxalic acid may also be used as the electrolyte. The use of oxalic acid as the electrolyte, however, poses problems such as brownish hue of the color of the anodic oxide film, high electrolytic voltage and high cost. For example, phosphoric acid, chromic acid, various organic acids, and mixtures of these acids may also be used as the electrolyte. The use thereof, however, is not common and results in increased cost. The concentration of the sulfuric acid bath is not particularly limited. In general, however, an about 10 to 20% sulfuric acid solution is used as the bath.

The bath temperature also is not particularly limited. In general, however, it is suitably 0° to 20° C. When the bath temperature is excessively low, a hard and strong film can be formed. In this case, however, the voltage is increased, necessitating the use of a high-voltage power source. On the other hand, when the bath temperature is excessively high, the anodic oxide film is soft and, hence, is likely to be damaged. Sealing after the anodization is necessary from the viewpoint of improving the corrosion resistance. A conventional sealing method is to conduct boiling of the anodized material in boiling pure water. Further, the addition of a sealing assistant based on a nickel salt to the pure water is also effective for sealing.

The anodic oxide film should have a thickness of not less than 8 $\mu$m in order to ensure color development and the corrosion resistance. The larger the thickness of the anodic oxide film, the deeper the color and the better the corrosion resistance. However, when the thickness of the anodic oxide film is excessively large, a lot of time is required for the treatment, which is cost-ineffective. For this reason, the thickness of the anodic oxide film is suitably not more than 40 $\mu$m, preferably not more than 30 $\mu$m.

Thus, use of an aluminum alloy, which can simply develop a gray or black color by anodization alone, could offer high thermal emissivity and low ionic contamination.

One embodiment of the utilization of the aluminum alloy radiator according to the present invention will be described with reference to FIG. 1. In this embodiment, a lead frame 2 and an IC chip 3 are mounted on a radiator 1 with the aid of an adhesive tape 4, followed by covering with a mold resin 5.

The process for producing an aluminum alloy radiator according to the present invention will be described in detail. An anodic oxide film 8 in the aluminum alloy radiator 1 may be formed by anode electrolytic treatment in an electrolyte composed mainly of an acid. The anodic oxide film 8 has micropores extending perpendicularly to the surface of the film. These micropores are causative of a deterioration in corrosion resistance. Therefore, sealing treatment is performed for clogging the micropores.

Regarding the sealing treatment, the present inventors have made detailed studies on method, conditions, post-treatment after sealing with a view to improving the adhesion of the mold resin 5 to the aluminum alloy radiator 1. As a result, they have found that heating of the anodic oxide film after the sealing treatment can improve the adhesion between the radiator 1 and the resin used for the packaging.

In the process according to the present invention, after the anodization, the material is subjected to sealing in a bath of pure water or a bath of pure water containing a sealing assistant, such as a nickel salt, at a temperature of 85° C. or above, subjected to conventional washing with water and then washing with pure water, and heat-treated in a hot-air drying oven. The atmosphere may be atmospheric without posing any problem. However, a corrosive atmosphere is unsuitable because it leads to corrosion of the radiator. Further, it is also possible to use an inert atmosphere, such as nitrogen or carbon dioxide gas, or a vacuum atmosphere. An atmosphere having a higher oxygen concentration than the air has the effect of repairing defects of the film, resulting in improved corrosion resistance.

The heating temperature should be 180° C. or above, preferably 200° C. or above, more preferably 225° C. or above. A temperature above 250° C. can offer improved adhesion. In this case, however, no significant effect can be attained, and a large amount of energy is unfavorably consumed. When the heat treatment temperature is 180° C., the heat treatment time is not less than 10 min, preferably about 15 min. In the case of heating at a temperature above 180° C., a shorter heating time suffices for satisfactory results.

Sulfuric acid is usually employed in the formation of the anodic oxide film 8. Further, oxalic acid or other organic acids may also be used. Anodic oxide films 8 may be classified into common films having a Vickers hardness of about 250 to 400 and hard films having higher hardness according to electrolysis conditions. Further, in any anodic oxide film of the radiator according to the present invention, heating can improve the adhesion of the film to the resin. The thickness of the anodic oxide film 8 should be not less than 8 $\mu$m in the radiator, preferably not less than 10 $\mu$m, more preferably not less than 15 $\mu$m. The larger the thickness of the anodic oxide film, the better the effect of improving the adhesion attained by heating.

DESCRIPTION OF PREFERRED EMBODIMENTS

EXAMPLE 1

A 1.5 mm-thick aluminum-0.7% iron alloy sheet was cut into a size of 24 mm square and joggled by pressing, followed by anodic oxidation in a 16% sulfuric acid bath using a lead electrode as a counter electrode under electrolysis conditions of bath temperature 15° C., current density 1.5 A/dm$^2$, and treatment time 30 min to form an about 15 $\mu$m-thick oxide film. In order to ensure corrosion resistance, the film was then boiled in pure water containing a sealing assistant based on a nickel salt for about 30 min. The film was gray in color. The specimen was kept at 100° C., and the radiant intensity of an infrared radiation having a long wavelength of 4.5 to 20 $\mu$m radiated from the specimen was measured. The extreme infrared integrated emissivity was then calculated based on a comparison of the above measured radiant intensity with the radiant intensity of the infrared radiation radiated from a perfect black body. The results are summarized in Table 4.

Further, the anodized material was boiled in 100 cc of distilled water for 5 min, and the distilled water was then analyzed by ion chromatography to quantitatively determine ion components which had been eluted from the heat slug material. The results are also summarized in Table 4.

EXAMPLE 2

A 1.5 mm-thick aluminum-1.5% iron alloy sheet was cut into a size of 24 mm square and joggled by pressing, followed by anodic oxidation in a 16% sulfuric acid bath using a lead electrode as a counter electrode under electrolysis conditions of bath temperature 15° C., current density 1.5 A/dm$^2$, and treatment time 30 min to form an about 15 µm-thick oxide film. In order to ensure corrosion resistance, the film was then boiled in pure water containing a sealing assistant based on a nickel salt for about 30 min. The film was deep gray in color. The specimen thus obtained was kept at 100° C., and the radiant intensity of an infrared radiation having a long wavelength of 4.5 to 20 µm radiated from the specimen was measured. The extreme infrared integrated emissivity was then calculated based on a comparison of the above measured radiant intensity with the radiant intensity of the infrared radiation radiated from a perfect black body. The results are summarized in Table 4.

Further, the anodized material was boiled in 100 cc of distilled water for 5 min, and the distilled water was then analyzed by ion chromatography to quantitatively determine ion components which had been eluted from the heat slug material. The results are also summarized in Table 4.

EXAMPLE 3

A 1.5 mm-thick aluminum-2% iron alloy sheet was cut into a size of 24 mm square and joggled by pressing, followed by anodic oxidation in a 16% sulfuric acid bath using a lead electrode as a counter electrode under electrolysis conditions of bath temperature 15° C., current density 1.5 A/dm$^2$, and treatment time 30 min to form an about 15 µm-thick oxide film. In order to ensure corrosion resistance, the film was then boiled in pure water containing a sealing assistant based on a nickel salt for about 30 min. The film was deep gray in color. The specimen was kept at 100° C., and the radiant intensity of an infrared radiation having a long wavelength of 4.5 to 20 µm radiated from the specimen was measured. The extreme infrared integrated emissivity was then calculated based on a comparison of the above measured radiant intensity with the radiant intensity of the infrared radiation radiated from a perfect black body. The results are summarized in Table 4.

Further, the anodized material was boiled in 100 cc of distilled water for 5 min, and the distilled water was then analyzed by ion chromatography to quantitatively determine ion components which had been eluted from the heat slug material. The results are also summarized in Table 4.

EXAMPLE 4

A 1.5 mm-thick aluminum-2.8% iron alloy sheet was cut into a size of 24 mm square and joggled by pressing, followed by anodic oxidation in a 16% sulfuric acid bath using a lead electrode as a counter electrode under electrolysis conditions of bath temperature 15° C., current density 1.5 A/dm$^2$, and treatment time 30 min to form an about 15 µm-thick oxide film. In order to ensure corrosion resistance, the film was then boiled in pure water containing a sealing assistant based on a nickel salt for about 30 min. The film was deep gray in color. The specimen was kept at 100° C., and the radiant intensity of an infrared radiation having a long wavelength of 4.5 to 20 µm radiated from the specimen was measured. The extreme infrared integrated emissivity was then calculated based on a comparison of the above measured radiant intensity with the radiant intensity of the infrared radiation radiated from a perfect black body. The results are summarized in Table 4.

Further, the anodized material was boiled in 100 cc of distilled water for 5 min, and the distilled water was then analyzed by ion chromatography to quantitatively determine ion components which had been eluted from the heat slug material. The results are also summarized in Table 4.

EXAMPLE 5

A 0.8 mm-thick aluminum-2% iron-0.5% manganese alloy sheet was pressed into a circular form having a diameter of 22 mm and joggled by pressing, followed by anodic oxidation in a 16% sulfuric acid bath using a lead electrode as a counter electrode under electrolysis conditions of bath temperature 10° C., current density 2 A/dm$^2$, and treatment time 37 min to form an about 25 µm-thick oxide film. Subsequently, sealing of the oxide film was performed in pure water. The film was deep gray in color. The procedure of Example 1 was repeated to measure the radiant intensity of an infrared radiation radiated from the specimen and to calculate the infrared integrated emissivity. The results are summarized in Table 4. Further, ion components, which had been eluted from the anodized material, were quantitatively determined. The results are also summarized in Table 4.

EXAMPLE 6

A 0.5 mm-thick aluminum-2% iron alloy sheet was cut into a size of 28 mm square and joggled by pressing, followed by anodic oxidation in a 18% sulfuric acid bath using a lead electrode as a counter electrode under electrolysis conditions of bath temperature 18° C., current density 2 A/dm$^2$, and treatment time 20 min to form an about 12 µm-thick oxide film. The film was then boiled in pure water containing a sealing assistant based on a nickel salt for about 30 min. The film was gray in color.

The procedure of Example 1 was repeated to measure the radiant intensity of an infrared radiation radiated from the specimen and to calculate the infrared integrated emissivity. The results are summarized in Table 4. Further, ion components, which had been eluted from the anodized material, were quantitatively determined. The results are also summarized in Table 4.

EXAMPLE 7

A 1.5 mm-thick aluminum-0.7% silicon alloy sheet was cut into a size of 24 mm square and joggled by pressing, followed by anodic oxidation in a 16% sulfuric acid bath using a lead electrode as a counter electrode under electrolysis conditions of bath temperature 15° C., current density 1.5 A/dm$^2$, and treatment time 30 min to form an about 15 µm-thick oxide film. In order to ensure corrosion resistance, the film was then boiled in pure water containing a sealing assistant based on a nickel salt for about 30 min. The film was gray in color. The specimen was kept at 100° C., and the radiant intensity of an infrared radiation having a long wavelength of 4.5 to 20 µm radiated from the specimen was measured. The extreme infrared integrated emissivity was then calculated based on a comparison of the above measured radiant intensity with the radiant intensity of the infrared radiation radiated from a perfect black body. The results are summarized in Table 4.

Further, the anodized material was boiled in 100 cc of distilled water for 5 min, and the distilled water was then analyzed by ion chromatography to quantitatively determine the ion component which had been eluted from the heat slug material. The results are also summarized in Table 4.

EXAMPLE 8

A 1.5 mm-thick aluminum-1.5% silicon alloy sheet was cut into a size of 24 mm square and joggled by pressing, followed by anodic oxidation in a 16% sulfuric acid bath using a lead electrode as a counter electrode under electrolysis conditions of bath temperature 15° C., current density 1.5 A/dm$^2$, and treatment time 30 min to form an about 15 μm-thick oxide film. In order to ensure corrosion resistance, the film was then boiled in pure water containing a sealing assistant based on a nickel salt for about 30 min. The film was gray in color. The specimen was kept at 100° C., and the radiant intensity of an infrared radiation having a long wavelength of 4.5 to 20 μm radiated from the specimen was measured. The extreme infrared integrated emissivity was then calculated based on a comparison of the above measured radiant intensity with the radiant intensity of the infrared radiation radiated from a perfect black body. The results are summarized in Table 4.

Further, the anodized material was boiled in 100 cc of distilled water for 5 min, and the distilled water was then analyzed by ion chromatography to quantitatively determine the ion component which had been eluted from the heat slug material. The results are also summarized in Table 4.

EXAMPLE 9

A 1.5 mm-thick aluminum-2.5% silicon alloy sheet was cut into a size of 24 mm square and joggled by pressing, followed by anodic oxidation in a 16% sulfuric acid bath using a lead electrode as a counter electrode under electrolysis conditions of bath temperature 15° C., current density 1.5 A/dm$^2$, and treatment time 30 min to form an about 15 μm-thick oxide film. In order to ensure corrosion resistance, the film was then boiled in pure water containing a sealing assistant based on a nickel salt for about 30 min. The film was deep gray in color. The specimen was kept at 100° C., and the radiant intensity of an infrared radiation having a long wavelength of 4.5 to 20 μm radiated from the specimen was measured. The extreme infrared integrated emissivity was then calculated based on a comparison of the above measured radiant intensity with the radiant intensity of the infrared radiation radiated from a perfect black body. The results are summarized in Table 4.

Further, the anodized material was boiled in 100 cc of distilled water for 5 min, and the distilled water was then analyzed by ion chromatography to quantitatively determine the ion component which had been eluted from the heat slug material. The results are also summarized in Table 4.

EXAMPLE 10

A 1.5 mm-thick aluminum-3.3% silicon alloy sheet was cut into a size of 24 mm square and joggled by pressing, followed by anodic oxidation in a 16% sulfuric acid bath using a lead electrode as a counter electrode under electrolysis conditions of bath temperature 15° C., current density 1.5 A/dm$^2$, and treatment time 30 min to form an about 15 μm-thick oxide film. In order to ensure corrosion resistance, the film was then boiled in pure water containing a sealing assistant based on a nickel salt for about 30 min. The film was deep gray in color. The specimen was kept at 100° C., and the radiant intensity of an infrared radiation having a long wavelength of 4.5 to 20 μm radiated from the specimen was measured. The extreme infrared integrated emissivity was then calculated based on a comparison of the above measured radiant intensity with the radiant intensity of the infrared radiation radiated from a perfect black body. The results are summarized in Table 4.

Further, the anodized material was boiled in 100 cc of distilled water for 5 min, and the distilled water was then analyzed by ion chromatography to quantitatively determine the ion component which had been eluted from the heat slug material. The results are also summarized in Table 4.

COMPARATIVE 1

A 1.5 mm-thick A6061 alloy (comprising 1.0% of magnesium, 0.65% of silicon, 0.3% of iron, 0.21% of copper, and 0.15% of chromium with the balance consisting of aluminum) sheet was cut into a size of 24 mm square and joggled by pressing, followed by anodic oxidation in a 16% sulfuric acid bath using a lead electrode as a counter electrode under electrolysis conditions of bath temperature 15° C., current density 1.2 A/dm$^2$, and treatment time 30 min to form an about 10 μm-thick oxide film. The film was then dyed in a dyeing solution containing 6 g/l anodizing dye, Deep Black MLW manufactured by Sandoz K. K., for 15 min. In order to stabilize the dye and ensure the corrosion resistance, the film was then boiled in pure water containing a sealing assistant based on a nickel salt for about 30 min. The film was jet-black in color.

The procedure of Example 1 was then repeated to measure the radiant intensity of an infrared radiation radiated from the specimen and to calculate the infrared integrated emissivity. The results are summarized in Table 4. Further, ion components, which had been eluted from the anodized material, were quantitatively determined. The results are also summarized in Table 4.

COMPARATIVE 2

A 0.8 mm-thick A1100 alloy sheet (comprising 0.3% silicon, 0.48% iron, and 0.09% copper with the balance consisting of aluminum) were pressed into a circular form having a diameter of 22 mm and then subjected to anodic oxidation in a 16% sulfuric acid bath using a lead electrode as a counter electrode under electrolysis conditions of bath temperature 20° C., current density 1.5 A/dm$^2$, and treatment time 20 min to form an about 9 μm-thick oxide film. The film was then dyed in a dyeing solution containing 6 g/l anodizing dye, Deep Black MLW manufactured by Sandoz K. K., for 15 min. In order to stabilize dye and ensure the corrosion resistance, the film was then boiled in pure water containing a sealing assistant based on a nickel salt for about 30 min. The film was jet-black in color.

The procedure of Example 1 was repeated to measure the radiant intensity of an infrared radiation radiated from the specimen and to calculate the infrared integrated emissivity. The results are summarized in Table 4.

Further, ion components, which had been eluted from the anodized material, were quantitatively determined. The results are also summarized in Table 4.

TABLE 4

| Ex. No. | Alloying constituent in aluminum alloy (wt %) | Emissivity (%) | Eluted ion (ng/cm$^2$) | | | |
|---|---|---|---|---|---|---|
| | | | Na | NH$_4$ | PO$_4$ | SO$_4$ |
| Ex. | | | | | | |
| 1 | 0.7% Fe | 78 | 30 | 8 | — | 750 |
| 2 | 1.5% Fe | 80 | 28 | 6 | 1 | 720 |
| 3 | 2.0% Fe | 81 | 32 | 8 | — | 750 |
| 4 | 2.8% Fe | 81 | 29 | 5 | 2 | 740 |

TABLE 4-continued

| Ex. No. | Alloying constituent in aluminum alloy (wt %) | Emissivity (%) | Eluted ion (ng/cm$^2$) | | | |
|---|---|---|---|---|---|---|
| | | | Na | NH$_4$ | PO$_4$ | SO$_4$ |
| 5 | 2% Fe—0.5% Mn | 86 | 20 | 12 | 3 | 680 |
| 6 | 2.0% Fe | 87 | 18 | 19 | 2 | 650 |
| 7 | 0.7% Si | 80 | 35 | 6 | — | 680 |
| 8 | 1.5% Si | 82 | 33 | 9 | 2 | 720 |
| 9 | 2.5% Si | 82 | 24 | 10 | — | 730 |
| 10 | 3.3% Si | 83 | 29 | 7 | — | 700 |
| Comp. Ex. | | | | | | |
| 1 | A6061 alloy (dyed) | 31 | 98 | 28 | 41 | 560 |
| 2 | A1100 alloy (dyed) | 36 | 137 | 43 | 24 | 530 |

As is apparent from the results given in Table 4, the examples of the present invention are superior, in emissivity of extreme infrared radiation, i.e., heat dissipation, to the comparative examples. Further, regarding the amount of eluted ions causative of ion contamination, there was a large difference in the amount of alkali ions between the examples of the present invention and the comparative examples. That is, the amount of the alkali ions eluted from the anodized materials according to the present invention was much smaller than that eluted from the comparative anodized materials. Thus, according to the present invention, a marked improvement over the prior art can be attained.

The process for producing an aluminum alloy radiator according to the present invention will be described in more detail with reference to Examples 11 to 13 and Comparative Examples 3 and 4.

In short, the process according to the present invention aims to provide a radiator, for a semiconductor device, which is not peeled off from a mold resin. This aim is irrespective of a lead frame 2 and a semiconductor chip 3, a die pad 7, or a bonding wire 6. Therefore, an experiment was carried out using a radiator 1 and a mold resin 5 only. As a result, it was confirmed that all the samples of the present invention created no peeling and had good adhesion, whereas comparative samples suffered from peeling.

EXAMPLE 11

A 1.5 mm-thick aluminum-2% iron alloy sheet was cut into a size of 24 mm square and pressed to form a joggled section 16 as shown in FIG. 2, followed by anodic oxidation in a 16% sulfuric acid bath using a lead electrode as a counter electrode under electrolysis conditions of bath temperature 15° C., current density 2 A/dm$^2$, and treatment time 38 min to form an about 25 μm-thick oxide film. In order to ensure corrosion resistance, the film was then subjected to sealing in pure water containing a sealing assistant based on a nickel salt at 90° C. for 25 min. The film was deep gray in color.

A peel acceleration test was performed wherein specimens were heat-treated in a circulating type hot-air drying oven at a temperature of 225° C. for 5 min, subjected to molding using an epoxy resin, MD-190M manufactured by Nitto Denko Corp., and then heated at 175° C. for 3 weeks. The specimens were observed under an ultrasonic microscope. As a result, it was found that none of the 20 tested specimens caused peeling.

EXAMPLE 12

A 0.8 mm-thick aluminum-2% iron-0.5% manganese alloy sheet was pressed into a circular form having a diameter of 22 mm and joggled by pressing, followed by anodic oxidation in a 16% sulfuric acid bath using a lead electrode as a counter electrode under electrolysis conditions of bath temperature 10° C., current density 1.5 A/dm$^2$, and treatment time 30 min to form an about 15 μm-thick oxide film. The film was then subjected to sealing in boiling pure water for 20 min. The film was deep gray in color.

A peel acceleration test was performed wherein specimens were heat-treated in a circulating type hot-air drying oven at a temperature of 200° C. for 5 min, subjected to molding using an epoxy resin, MD-7400 manufactured by Nitto Denko Corp., and then heated at 175° C. for 3 weeks. As a result, it was found that, as with the specimens tested in Example 11, none of the 20 tested specimens caused peeling.

EXAMPLE 13

A 0.5 mm-thick A6061 alloy sheet was cut into a size of 28 mm square and joggled by pressing, followed by anodic oxidation in a 18% sulfuric acid bath using a lead electrode as a counter electrode under electrolysis conditions of bath temperature 18° C., current density 1.2 A/dm$^2$, and treatment time 30 min to form an about 10 μm-thick oxide film. The film was then dyed in a dyeing solution containing 6 g/l anodizing dye, Deep Black MLW manufactured by Sandoz K. K., for 15 min. The treated sheet was thoroughly washed, and the film was then subjected to sealing in pure water containing a sealing assistant based on a nickel salt at 90° C. for about 20 min. The film was jet-black in color. Subsequently, the sheet was heat-treated in air using a circulating type hot-air drying oven in the air at a temperature of 180° C. for 15 min.

For the products thus obtained, a peel acceleration test was performed wherein the products were subjected to molding using an epoxy resin, MD-7400 manufactured by Nitto Denko Corp., and then heated at 175° C. for 3 weeks. As a result, it was found that none of the 20 tested specimens caused peeling, indicating that, as with the products prepared in Examples 11 and 12, the products prepared in this example had excellent adhesion to the mold resin.

COMPARATIVE 3

A 1.5 mm-thick A6061 alloy sheet was cut into a size of 24 mm square and joggled by pressing, followed by anodic oxidation in a 16% sulfuric acid bath using a lead electrode as a counter electrode under electrolysis conditions of bath temperature 15° C., current density 1.2 A/dm$^2$, and treatment time 30 min to form an about 10 μm-thick oxide film. The film was then dyed in a dyeing solution containing 6 g/l anodizing dye, Deep Black MLW manufactured by Sandoz K. K., for 15 min. In order to stabilize dye and ensure the corrosion resistance, the film was then subjected to sealing in pure water containing a sealing assistant based on a nickel salt at 90° C. for 30 min. The film was jet-black in color.

In the same manner as in Example 11, the specimens thus obtained were subjected to a peel acceleration test wherein the specimens were subjected to molding using an epoxy resin, MD-190M manufactured by Nitto Denko Corp., and then heated at 175° C. for 3 weeks. As a result, it was found that peeling was created in 5 out of the 20 tested specimens.

COMPARATIVE 4

A 0.8 mm-thick aluminum-2% iron-0.5% manganese alloy was pressed into a circular form having a diameter of 22 mm and joggled by pressing, followed by anodic oxidation in a 16% sulfuric acid bath using a lead electrode as a counter electrode under electrolysis conditions of bath temperature 10° C., current density 1.5 A/dm$^2$, and treatment time 30 min to form an about 15 μm-thick oxide film. The film was then subjected to sealing in boiling pure water for 20 min. The film was deep gray in color. Subsequently, the sheet was heat-treated in a circulating type hot-air drying oven at a temperature of 150° C. for 30 min.

For the products thus obtained, a peel acceleration test was performed wherein the products were subjected to molding using an epoxy resin, MD-7400 manufactured by Nitto Denko Corp., and then heated at 175° C. As a result, it was found that peeling was created in 3 out of the 20 tested specimens.

What is claimed is:

1. An aluminum alloy radiator for a plastic molded type semiconductor device, said radiator comprising an anodized aluminum alloy, wherein the aluminum alloy comprises 0.5 to 3.0% by weight of iron with the balance consisting of aluminum and unavoidable impurities.

2. An aluminum alloy radiator for a plastic molded type semiconductor device, said radiator comprising an anodized aluminum alloy, wherein the aluminum alloy comprises 0.5 to 3.0% by weight of iron and 0.2 to 0.8% by weight of manganese with the balance consisting of aluminum and unavoidable impurities.

3. An aluminum alloy radiator for a plastic molded type semiconductor device, said radiator comprising an anodized aluminum alloy, wherein the aluminum alloy comprises 0.5 to 3.0% by weight of iron and 0.2 to 0.8% by weight of nickel with the balance consisting of aluminum and unavoidable impurities.

4. An aluminum alloy radiator for a plastic molded type semiconductor device, said radiator comprising an anodized aluminum alloy, wherein the aluminum alloy comprises 0.5 to 3.5% by weight of silicon with the balance consisting of aluminum and unavoidable impurities.

* * * * *